United States Patent

Muranaka et al.

Patent Number: 5,902,774
Date of Patent: May 11, 1999

[54] METHOD FOR PREPARING HIGH-TEMPERATURE SUPERCONDUCTING WIRE

[75] Inventors: Koji Muranaka; Kenichi Sato; Takeshi Hikata, all of Osaka, Japan

[73] Assignees: Sumitomo Electric Industries, Ltd., Japan; Research Development Corporation of Japan, Japan

[21] Appl. No.: 08/955,322

[22] Filed: Oct. 20, 1997

Related U.S. Application Data

[63] Continuation of application No. 08/538,110, Oct. 2, 1995, abandoned, which is a continuation of application No. 08/238,127, May 4, 1994, abandoned.

[30] Foreign Application Priority Data

May 10, 1993 [JP] Japan .................................. 5-108395

[51] Int. Cl.[6] .................................................. H01L 39/24
[52] U.S. Cl. .......................... 505/433; 29/423; 29/599; 505/481; 505/501
[58] Field of Search ................. 29/423, 599; 156/89, 156/289; 505/430, 433, 481, 500, 501

[56] References Cited

U.S. PATENT DOCUMENTS

| 5,102,483 | 4/1992 | Sawada et al. | ............................ 156/89 |
| 5,140,006 | 8/1992 | Woolf . | |

FOREIGN PATENT DOCUMENTS

| A-0 303 036 | 2/1989 | European Pat. Off. . |
| A-0 348 104 | 12/1989 | European Pat. Off. . |
| 58-22335 | 2/1983 | Japan . |
| 4-274115 | 9/1992 | Japan . |
| 4-329217 | 11/1992 | Japan . |

OTHER PUBLICATIONS

Patent Abstract of Japan vol. 016, No. 367 (E–1245) Aug. 7, 1992 & JP–A–04 6 906 (Furukawa Electric Co. Ltd.: The) Apr. 17, 1992.
Patent Abstracts of Japan, vol. 016, No. 497 (E–1279) Oct. 14, 1992 & JP–A–04 181, 704 (Sumitomo Heavy Ind. Ltd.) Jun. 29, 1992.
Patent Abstracts of Japan, vol. 014, No. 564 (E–1013) Dec. 14, 1990 & JP–A–02 246 101 (Hitachi Cable Ltd.) Oct. 1, 1990.

*Primary Examiner*—Joseph M. Gorski
*Attorney, Agent, or Firm*—Pennie & Edmonds LLP

[57] ABSTRACT

A method of producing a tape-shaped superconducting wire is provided. The wire maintains a high critical temperature and a high critical current density along the overall length thereof. In this method, raw material powder for the oxide superconductor is first charged in a silver sheath and the sheath charged with the powder is subjected to plastic working to prepare a first flat type wire. On the other hand, a second wire consisting of a tape wire formed by coating a surface of a flat type wire having at least an outer surface consisting essentially of silver or a silver alloy with a metal oxide or ceramics, or a tape wire containing ceramics fibers and a binder dissipated by heat treatment is prepared. The first and second wires are layered with each other, and tightly wound in a pancake coil shape. The wires wound in the pancake coil shape are heat treated for sintering the oxide superconductor. After the heat treatment, the first wire is separated from the second wire.

17 Claims, 6 Drawing Sheets

METHOD FOR PREPARING HIGH-TEMPERATURE SUPERCONDUCTING WIRE

This is a continuation of application Ser. No. 08/538,110, filed Oct. 2, 1995, now abandoned, which is a continuation of application Ser. No. 08/238,127, filed May 4, 1994, now abandoned.

BACKGROUND OF THE INVENTION

1. Field of the Invention

The present invention relates to a method of preparing a high-temperature superconducting wire, and more particularly, it relates to a method of preparing an oxide superconducting wire, which is applied to a high-temperature superconducting coil or the like, having a high critical current density at the liquid nitrogen temperature.

2. Description of the Background Art

With discovery of yttrium, bismuth and thallium oxide superconducting materials respectively exhibiting critical temperatures (Tc) of 90 K, 108 K and 125 K, which are higher than the liquid nitrogen temperature (77.3 K), application of oxide superconducting materials to the fields of energy and electronics are now being expected. In particular, preparation of a wire from an oxide high-temperature superconductor has been positively developed since the discovery of such a material, for the purpose of application to the field of energy. Among various methods which have been studied in relation to such preparation of superconducting wires, there is a method of covering an oxide superconductor with a stabilizing metal for preparing a wire. According to this method, a silver sheath which is charged with an oxide superconductor is subjected to plastic working such as wire drawing and rolling, and thereafter sintered to provide a wire. In this process, high orientation is supplied to the superconductor which is covered with silver by the combination of plastic working and sintering, thereby implementing a high critical current. When a high-temperature superconducting wire is applied to a coil for a magnet, it is possible to take a process of heat treating a long wire which is obtained by charging a silver sheath with an oxide superconductor and performing plastic working, further performing plastic working, and coiling the same to heat treat the coil again. It has been desired that the superconducting coil obtained through such a process maintains a high critical current density along its overall length, in addition to a high critical temperature.

Figure 1:
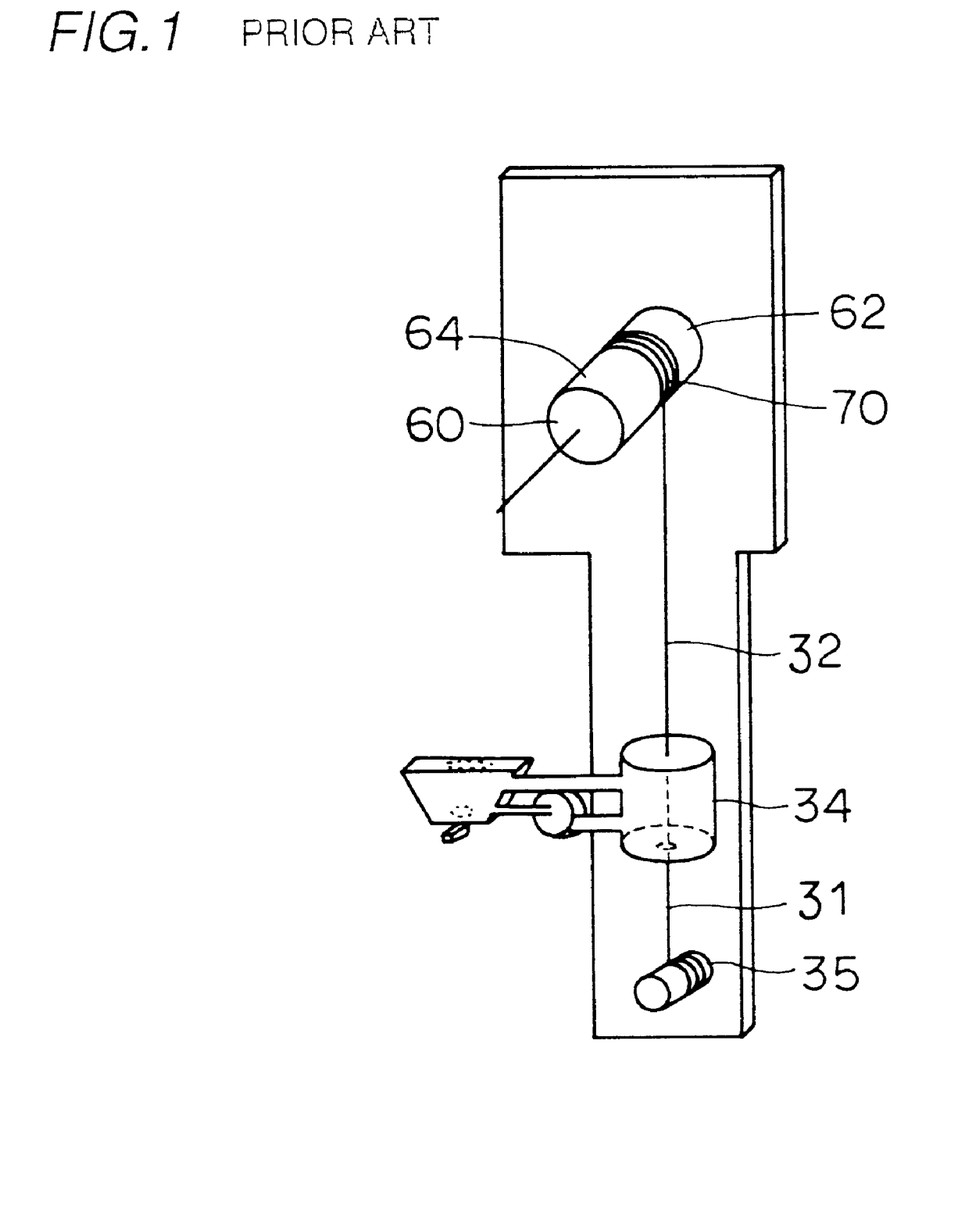
FIG. 1 typically shows a concrete example of an apparatus employed for a conventional heat treatment method.

In the aforementioned process, a tape wire which is obtained after the first plastic working is generally coiled and heat treated. In such heat treatment of the wire, it is necessary to prevent adjacent turns of the coiled wire from adhesion to each other, and from diffusion of components therebetween. Japanese Patent Laying-Open No. 4-274115 (1992) discloses a method of heat treating a superconducting wire of a high transition temperature (high Tc) having a silver protective clad layer, by bonding a layer consisting of ceramics onto the silver clad layer. FIG. 1 shows an apparatus which is disclosed in this gazette. Referring to FIG. 1, a superconducting wire 31 having the protective clad layer is supplied from a spool 35, coated with a paint containing ceramics and a cellulose binder in a container 34, and wound on another spool 60 as a wire 32. The wire 32 coated with the ceramics paint is wound on the spool 60 as a parallel coil (solenoid-shaped coil) 70. A metal mesh 62 is arranged between the wire 32 and a peripheral surface 64 of the spool 60, so that stress which is caused by difference in thermal expansion between the wire 32 and the spool 60 can be absorbed. The wire 32 wound on the spool 60 is transferred to a heating furnace, and heat treated for sintering.

During the heat treatment, the ceramics contained in the paint forms diffusion preventing layers between adjacent turns of the coiled wire 32. The spool 60 provided with the wire 32 is horizontally arranged in the furnace with respect to the gravitational direction. During the heat treatment, the respective turns of the solenoid-shaped coil 70 are loosened due to thermal expansion. Following such loosening, the wire 32 hangs down by its own weight. As the result, the wire 32 may be deformed by its own weight. Such deformation reduces superconductivity of the wire 32, particularly its critical current density. When the wire 32 coated with the paint is heat treated for sintering, further, the components of the paint strongly adhere to the wire 32. Thus, it is extremely difficult to separate the paint components from the wire 32 for exposing the silver clad layer on the wire 32 after the heat treatment.

When the tape-shaped wire which is obtained after the first plastic working is heat treated in a furnace in the aforementioned process of preparing a silver sheath oxide superconducting wire, on the other hand, gas may be partially generated from the charged powder to partially expand the silver sheath. Further, a spatial range which can uniformly set heating temperature distribution in the heating furnace is generally limited to some extent, and hence it is difficult to perform the heat treatment under uniform conditions as the wire is increased in length. Such partial expansion of the wire or ununiform heat treatment leads to ununiformalization of the subsequent plastic working, resulting in portions having low critical current densities in the finally obtained coil. In order to prevent such a disadvantage, therefore, improvement of the heat treatment is awaited.

Another method of heat treating a long wire is adapted to heat a wire which is wound in a multilayer manner. According to this method, it is possible to heat the wire in a relatively compact state. Japanese Patent Laying-Open No. 4-329217 (1992) discloses a method of holding a tape wire, which is prepared by covering raw material powder for an oxide superconductor with a metal sheath, between tapes consisting only of ceramics having a smaller thermal expansion coefficient than the metal sheath, coiling the tape wire held between the ceramics tapes, and heat treating the coiled tape wire. This gazette proposes a technique of suppressing thermal expansion of the metal sheath by holding the tape wire with the tapes consisting only of ceramics. When the tape wire is constrained with the ceramics which is different in thermal expansion coefficient, however, stress may be caused in heating and cooling, to deform the tape wire. On the other hand, Japanese Patent Laying-Open No. 58-22335 (1983) discloses a process of winding a metal wire having a surface consisting of copper or a copper alloy on a reel in a multilayer manner while interposing glass cloth or paper between the layers and annealing the wound metal wire. However, no preferable result can be obtained when this technique is applied to preparation of a high-temperature superconducting wire. If a tape of glass cloth is lap-wound with a silver sheath tape wire and heat treated, stress is caused during the heat treatment step similarly to the case of the tape consisting of only ceramics, to bring partial deformation of the tape such as buckling, for example, although diffusion between the layered portions of the silver sheath can be prevented. Further, a relatively thick glass tape is unadvantageous for improving the winding density for heat treating the wire in a more compact state. When paper is employed in place of glass or ceramics, on the other hand, the paper is immediately burnt away under the sintering temperature. Thus, it is impossible to sufficiently suppress diffusion and adhesion between the lapped portions of the silver sheath with paper.

SUMMARY OF THE INVENTION

An object of the present invention is to provide a method of heat treating a tape wire which is wound in a pancake shape with no local deformation while suppressing diffusion of a material from a stabilizing member in a method of preparing a tape-shaped oxide superconducting wire.

Another object of the present invention is to prepare a long oxide superconducting wire which can solve the aforementioned problems and maintain a high critical temperature and a high critical current density along its overall length.

According to the present invention, provided is a method of producing a high-temperature superconducting wire comprising an oxide superconductor which is covered with at least one stabilizing material selected from the group consisting of silver and a silver alloy. In a method according to an aspect of the present invention, powder which consists essentially of at least one material selected from the group consisting of an oxide superconductor and a source material having an element composition capable of forming an oxide superconductor is charged in a sheath consisting essentially of at least one stabilizing material selected from the group consisting of silver and a silver alloy, and the sheath which is charged with the powder is subjected to plastic working, to prepare a first flat type wire. Further, at least one of the first flat type wire and a flat type wire having at least an outer surface consisting essentially of silver or a silver alloy is coated with a heat-resistant paint containing at least one material selected from the group consisting of silicone resin, metal alkoxide and metal organic acid salt as a main component, and the wire coated with the paint is heat treated, to prepare a second flat type wire having a coating consisting essentially of a material selected from the group consisting of polysiloxane, a metal oxide and ceramics. Then, the first and second wires are superposed with each other and wound in a pancake shape so that the first wire is in contact with the coating of the second wire while portions of the first wire themselves are not in contact with each other. The wires wound in a pancake shape are heat treated for sintering the oxide superconductor. After the heat treatment, the first wire is separated from the second wire.

In a method according to another aspect of the present invention, powder consisting essentially of at least one material selected from the group consisting of an oxide superconductor and a source material having an element composition capable of forming an oxide superconductor is charged in a sheath consisting essentially of at least one stabilizing material selected from the group consisting of silver and a silver alloy, and the sheath which is charged with the powder is subjected to plastic working, to prepare a first flat type wire. Further, at least one of the first flat type wire and a flat type wire having at least an outer surface consisting essentially of silver or a silver alloy is coated with a heat-resistant paint containing at least one material selected from the group consisting of silicone resin, metal alkoxide and metal organic acid salt as a main component, and the wire coated with the paint is heat treated to prepare a second flat type wire having a coating consisting essentially of a material selected from the group consisting of polysiloxane, a metal oxide and ceramics. Then, the first and second wires are layered with a combustible third flat material interposed between the wires, and wound in a pancake shape. The wires which are wound in a pancake shape are heat treated for sintering the oxide superconductor. Then, the first wire is separated from the second wire. In this method, the third flat material is at least partially burnt away in the heat treatment for sintering.

In a method according to still another aspect of the present invention, powder consisting essentially of at least one material selected from the group consisting of an oxide superconductor and a source material having an element composition capable of forming an oxide superconductor is charged in a sheath consisting essentially of at least one stabilizing material selected from the group consisting of silver and a silver alloy, and the sheath which is charged with the powder is subjected to plastic working, to prepare a flat wire. Further, a protective tape containing particles or fibers consisting essentially of a material which is not substantially changed by the heat treatment for sintering the oxide superconductor substantially with no diffusion of its component in the flat type wire, and a binder consisting essentially of a material which is at least partially dissipated by the heat treatment is provided. Then, the protective tape and the flat type wire are superposed and wound in a pancake shape so that portions of the flat type wire are not in contact with each other. The wire which is wound in a pancake shape is heat treated for sintering the oxide superconductor. After the heat treatment, the heat treated protective tape material is separated from the flat type wire. In this method, the binder is at least partially dissipated by the heat treatment.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
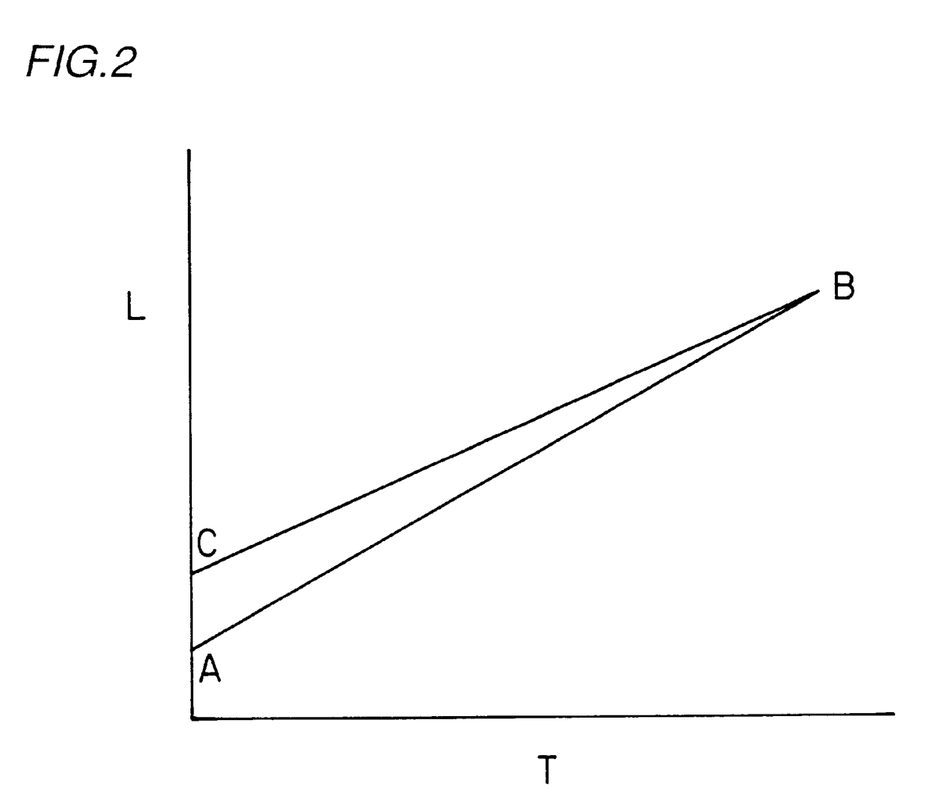
FIG. 2 is a graph typically showing changes in length of the tape wire during sintering and cooling steps in preparation of the tape-shaped oxide superconducting wire.

A tape wire, which is obtained by performing plastic working on a stabilizer material sheath charged with raw material powder for an oxide superconductor, shows behavior as shown in FIG. 2, in a sintering step. Referring to FIG.

2, the axis of ordinates shows temperatures, and the axis of abscissas shows lengths of the wire. First, the tape wire expands along a route A-B as the temperature is increased. After sintering, on the other hand, the tape wire is cooled and contracts along a route B-C. Thus, the wire has different lengths before heating and after cooling. Such behavior may conceivably be caused since the tape wire is made of a composite material consisting of ceramics and a metal and the ceramics is sintered by the heat treatment. When an insulating material for preventing diffusion is interposed between portions of the tape wire which is wound in a pancake shape, therefore, it is desirable that the insulating material can follow such behavior of the wire. When a material having a single thermal expansion coefficient with substantially equal lengths before heating and after cooling is employed as the insulating material, on the other hand, stress results from difference in behavior between the insulating material and the tape wire. This stress causes deformation of the tape wire. In the aforementioned conventional methods, the tape consisting of only glass or ceramics is unpreferable for this reason.

According to the present invention, the insulating material is prepared from a material showing behavior which is close to that of the tape wire by heat treatment and cooling. A tape wire which is coated with ceramics or a metal oxide, or a wire prepared by coating a flat type wire, consisting of silver or a silver alloy at least in its outer surface, with ceramics or a metal oxide is preferably employed as such an insulating material. When a combustible material is interposed between such an insulating material and the tape wire, it is possible to dissipate the combustible material in a sintering step, thereby defining a clearance between the tape wire and the insulating material. This clearance further absorbs stress which is caused between the tape wire and the insulating material. When the insulating material is prepared from a tape containing particles or fibers which are not changed during sintering and a binder which is dissipated during the sintering, on the other hand, the binder is gasified and dissipated by heating reaction, whereby bonding between the particles or the fibers is released. Due to such releasing of the bonding, the insulating material will not constrain behavior of the tape wire. The particles or fibers are mobilized during the heat treatment, whereby occurrence of stress is prevented between the tape wire and the insulating material. After completion of the sintering, the tape wire can freely contract since the particles or fibers are substantially not bonded with each other.

According to the present invention, a flat wire employed for obtaining the second flat wire by the coating preferably has a thermal expansion coefficient and a coefficient of contraction which are extremely close to those of the first flat wire. It is extremely preferable that such a flat wire for the second wire has the same structure and composition as those of the first flat wire, while the flat wire for the second wire can alternatively be prepared from a wire which is coated with silver or a silver alloy to have a thermal expansion coefficient and a coefficient of contraction which are close to those of the first wire, or from a wire consisting essentially of silver or a silver alloy. Such a wire is coated with a heat-resistant paint, to be provided with a heat-resistant coating by heat treatment. The coating is preferably 2 to 100 $\mu$m in thickness, for example. Further, the coating preferably strongly adheres to the wire, so that the same is not separated by a commercially available adhesive tape, for example. In relation to thermal expansion and contraction, difference between the first and second wires is preferably smaller. When first and second wires of the same lengths are layered and wound to be heat treated for sintering and thereafter cooled to the room temperature, for example, difference in length between the wires is preferably not more than 1%, more preferably not more than 0.1%, of the overall length of the first wire after the cooling. It is possible to more effectively suppress occurrence of thermal stress by employing such a second wire. The second flat wire can preferably has a thickness in the range of 50 to 1000 $\mu$m.

The heat-resistant paint is mainly composed of silicone resin, metal alkoxide, or metal organic acid salt. Such a component is dissolved or dispersed in a proper solvent such as alcohol, acetone or water. The heat-resistant paint can contain ceramics powder consisting of silica, alumina, zirconium, silicon nitride, silicon carbide, aluminum nitride or the like. Further, the heat-resistant paint may contain magnesia, manganese oxide, chromium oxide or copper oxide. The heat-resistant paint containing silicone resin can be obtained from Gamma Chemical Co. as Gamma 1100 (trade name), for example, while that containing metal alkoxide can be obtained from Nekkenkagaku Kougyo Co. as the trade name Ceratop type II, for example, and that containing metal organic acid salt can be obtained from Nekkenkagaku Kougyo Co, as the trade name Ceratop type I, for example. When the heat-resistant paint is mainly composed of silicone resin, the solvent can be removed by heat treatment for forming a coating mainly composed of polysiloxane on the wire. The silicone resin may be also decomposed by heat treatment for forming a ceramics coating which is mainly composed of silicon oxide on the wire. The paint is preferably heat treated at a temperature of at least 200° C., for example. The coating as formed has excellent heat resistance and insulativity. When the heat-resistant paint is mainly composed of metal alkoxide, it is possible to form a coating which is mainly composed of a metal oxide or ceramics on the wire through hydrolysis and polycondensation reaction of the metal alkoxide by heat treating the paint in accordance with a sol-gel method, for example. In this case, the heat-resistant paint contains a proper solvent such as alcohol, water and acid such as nitric acid, in addition to the metal alkoxide. The heat-resistant paint is preferably heat treated at a temperature of at least 200° C., for example. The coating as formed has excellent heat resistance and insulativity. When the heat-resistant paint is mainly composed of metal organic acid salt, it is possible to form a coating which is mainly composed of a metal oxide or ceramics on the wire by thermally decomposing the metal organic acid salt by heat treating the paint. The paint is preferably heat treated at a temperature of at least 200° C., for example. The coating as formed has excellent heat resistance and insulativity.

According to the present invention, the oxide superconductor can be sintered at a temperature of 800 to 900° C., preferably 830 to 870° C., more preferably 840 to 850° C. After the heat treatment, the first wire which is separated from the second wire may be further subjected to rolling and heat treatment. A wire having excellent superconductivity can be obtained by repeating rolling and sintering.

The first and second wires may be layered with each other and wound so that the combustible third flat body is interposed between the first and second wires when heat treatment is carried out. It is possible to sinter the first flat type wire and burn the third flat body by the heat treatment. In this case, the combustible third body may be completely or partially burnt by the heat treatment. A material completely burnt by heat treatment can be preferably prepared from a body consisting essentially of craft paper or the like, while a partially burnt material can be preferably prepared from a body consisting essentially of a mixture of ceramics (for example, alumina) powder or fibers and sizing material, or the like. The combustible third flat material can have a thickness in the range from 50 to 1000 $\mu$m.

According to the present invention, the particles or fibers, contained in the protective tape, consisting essentially of a material which is not dissipated by sintering can be preferably prepared from ceramics particulates of about 2 to 20 $\mu$m in particle size or ceramics short fibers of about 10 to 200 $\mu$m in length and 2 to 20 $\mu$m in width selected from the group consisting of oxides, nitrides and carbides of metals and semimetals. On the other hand, the binder consisting essentially of a material which is dissipated by sintering can be preferably prepared from an organic sizing material or the like. In more concrete terms, such a sizing material can be prepared from a cellulose based adhesive, a natural rubber based adhesive or the like. It is possible to obtain an article which is called ceramics paper or a ceramics sheet as a common name, by adding the binder consisting of a material dissipated by sintering to the particles or fibers consisting of a material not dissipated by sintering. Such an article can be obtained as a commercial item at a relatively low cost. For example, ceramics paper which is made by adding a small amount of the organic sizing material (cellulose based adhesive) as the binder to short fibers of alumina ($Al_2O_3$) of about 100 $\mu$m length and 2 $\mu$m in diameter is available as a commercial item (for example, trade name Sun Paper, Taiyo Chemical Co.). The thickness of the ceramics paper or the ceramics sheet is within a range of 50 to 1000 $\mu$m, for example. The ceramics paper or the ceramics sheet is interposed between adjacent portions of the flat type wire in sintering. Ceramics paper or ceramics sheet which is available as a commercial item is generally in the form of a square having certain degrees of width and length, and hence it is preferable to cut the same into tape-shaped segments of about 4 mm in width and connect these tape-shaped segments into a certain degree of length, in order to employ the paper or sheet in the present invention. If a continuous long tape-shaped article is present, it is more preferable to use the same, as a matter of course.

According to the present invention, the oxide superconductor includes the bismuth based oxide superconductor such as that of Bi—Sr—Ca—Cu—O or (Bi, Pb)—Sr—Ca—Cu—O system, the yttrium based oxide superconductor such as that of Y—Ba—Cu—O system, or the thallium based oxide superconductor such as that of (Tl, Pb)—Ca—Ba—Cu—O system. In particular, the bismuth based oxide superconductor is preferable in consideration of a high critical temperature, easiness in attainment of a high critical current density, and low toxicity. Powder of the oxide superconductor or raw material powder therefor can be prepared by mixing oxides or carbonates of elements capable of forming the superconductor in the usual way to attain desired composition ratios for forming the superconductor, sintering the mixture by heat treatment and crushing the sintered material, for example. The mean particle diameter of such powder is preferably not more than 2 $\mu$m, and more preferably not more than 1 $\mu$m, for example. The raw material powder for the oxide high-temperature superconductor can also be prepared from a precursor containing a low-temperature phase (Tc: 80 K) material as a main superconducting phase and a non-superconducting phase material while having the element composition ratio which can form a 110 k phase (high temperature phase) Bi based oxide superconductor. Such powder is charged in a stabilizing metal sheath to obtain a superconductor having a desired composition ratio. The stabilizing material sheath charged with the powder is wire-drawn and rolled, to provide the first wire.

Figure 3:
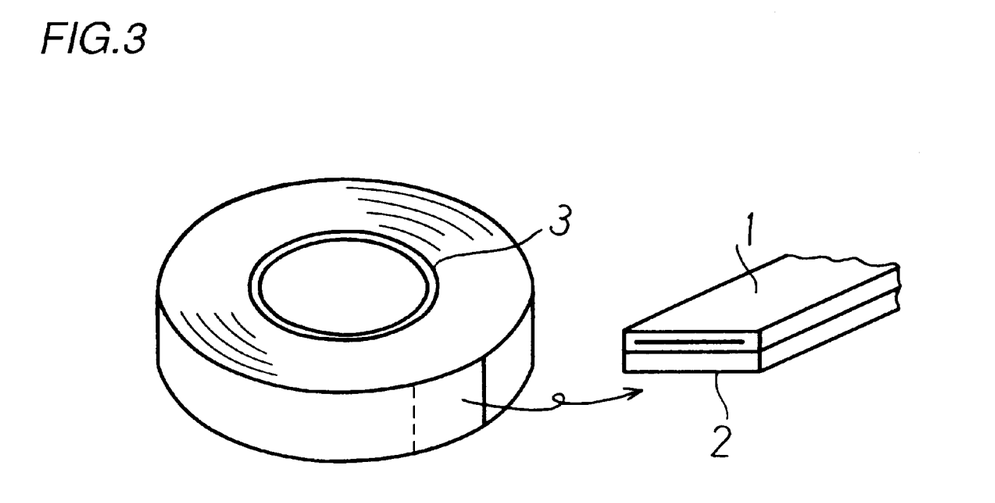
FIG. 3 is a perspective view showing a flat type wire which is tightly wound in a pancake shape in heat treatment according to the present invention.

The first flat type wire, which is obtained by charging the powder of the superconductor or the raw material powder therefor in the sheath and performing plastic working thereon, is placed on the second flat type wire having a heat-resistant coating, and these wires are wound together as shown in FIG. 3, for example. FIG. 3 shows the first flat type wire 1, which is wound on a spool 3 together with the second flat type wire 2 in a pancake coil shape and gently tightened. At this time, portions of the first flat type wire 1 which are close to each other are separated by the second flat type wire 2. Due to such winding, a proper pressure is uniformly applied to a major surface of the first wire 1. When heat treatment is carried out with application of such a pressure, it is possible to equalize expansion of the sheath material caused by generation of gas, thereby preventing the aforementioned partial expansion of the sheath material.

Figure 4A:
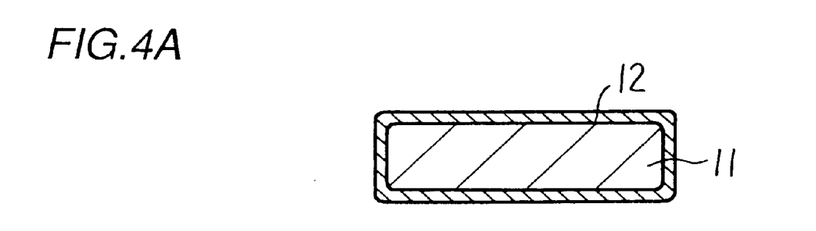
FIGS. 4A and 4B are sectional views showing second flat type wires which are provided with heat-resistant coatings according to the present invention.
Figure 4B:
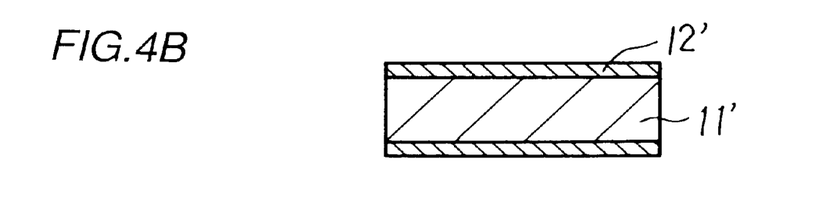

The second wire which is superposed on the first wire has a sectional structure shown in FIG. 4A or 4B, for example. Referring to FIG. 4A, a heat-resistant coating 12 is formed around a wire 11. Referring to FIG. 4B, on the other hand, heat-resistant coatings 12' are formed on major surfaces of a wire 11'. In either structure, the two wires are so superposed with each other that major surfaces of the first and second wires are covered with each other and the wires are tightly wound together, whereby portions of the wound first wire are separated from each other by the second wire not to be in contact with each other. Thus, the sheath material portions can be prevented from adhering to each other by diffusion in the first wire during heat treatment. The heat-resistant coating, which is formed by the heat treating a heat-resistant paint containing at least any one of ceramics, silicone resin, metal alkoxide and metal organic salt acid as a main component, is hardly bonded to the first flat type wire upon heat treatment, because such a coating consists essentially of ceramics, for example. After the heat treatment, therefore, the first wire can be relatively easily separated from the second wire. Further, the second wire is prepared by forming a heat-resistant coating on a wire consisting essentially of silver or a silver alloy at least in its outer surface, or by forming a heat-resistant coating on the first wire. Therefore, the second wire has a thermal expansion coefficient and a coefficient of contraction which are extremely close to those of the first wire. When these wires are superposed with each other, tightly wound, heat treated and cooled, the wires expand and contract at similar rates. Therefore, a pressure resulting from tight winding is uniformly maintained along the overall wires in the heat treatment step. If the second wire is replaced by a wire such as a glass tape having a thermal expansion coefficient smaller than that of the first wire, on the other hand, the first wire is further extended by the heat treatment, to cause buckling. Such buckling leads to reduction in critical current density of the wire. The second flat type wire can be repeatedly used, because the same maintains its initial strength with no deterioration after the heat treatment, dissimilarly to the aforementioned glass tape, which is broken by the heat treatment. Thus, employment of the second flat type wire leads to reduction in cost for preparing the high-temperature superconducting wire.

Figure 5:
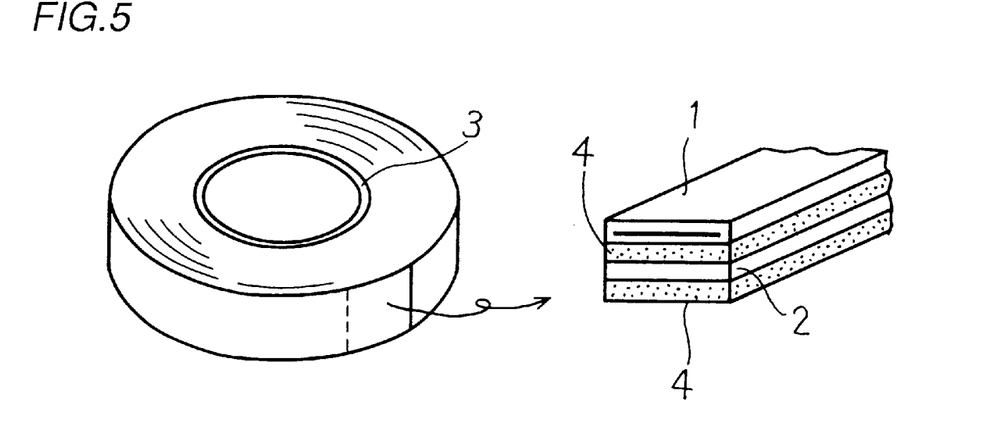
FIG. 5 is a perspective view showing another flat type wire which is tightly wound in a pancake shape in heat treatment according to the present invention.

According to the present invention, the first and second flat type wires can also be layered with the combustible third flat body interposed between them, tightly wound the same, and subjected to heat treatment as shown in FIG. 5, for example. Referring to FIG. 5, the combustible third flat body or tape 4 is held between first and second flat type wires 1 and 2, which in turn are wound on spool 3 in a pancake coil shape and gently tightened. Approximate portions of the first wire 1 are separated from each other by the third flat body 4, the second wire 2 and the third flat body 4. When the pancake coil is heat treated similarly to the above, the sheath material is prevented from partially expanding and adhering by diffusion while the whole or most part of the third flat body is burnt away to define a small clearance, which is substantially equal to the thickness of the third flat body, between the first and second flat type wires 1 and 2. Adhesion between the first and second wires 1 and 2 is more completely avoided due to this clearance. After the heat treatment, therefore, the first wire 1 can be further easily separated from the second wire 2.

Figure 6:
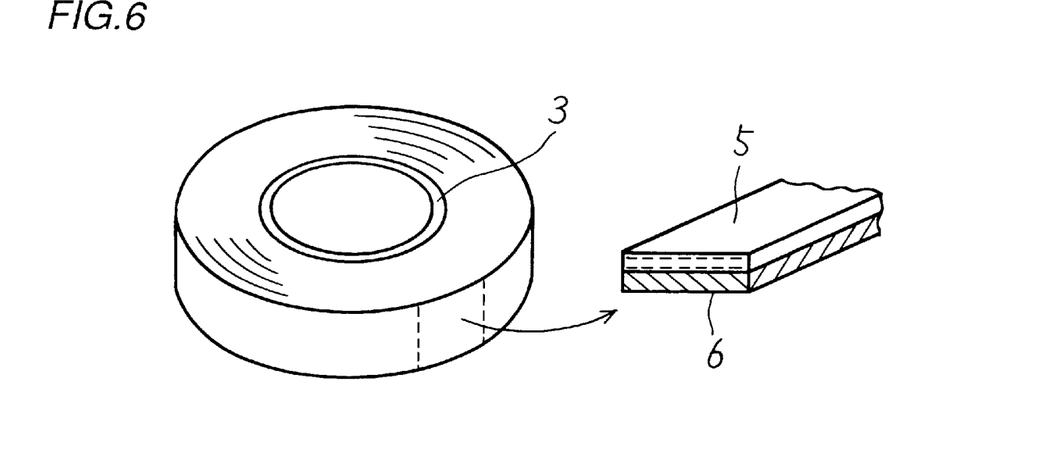
FIG. 6 is a perspective view showing still another flat type wire which is tightly wound in a pancake shape in heat treatment according to the present invention.

FIG. 6 shows the flat type wire 5, which is superposed on a tape-shaped ceramics paper 6, wound on spool 3 in a pancake coil shape, and gently tightened. At this time, adjacent portions of the flat wire 5 are separated from each other by the tape-shaped ceramics paper 6. Due to such tight winding, the long flat wire 5 is brought into an extremely compact shape, while a proper pressure is uniformly applied to a major surface of the flat type wire 5. When sintering is carried out under such a pressure, expansion of the sheath material which can be caused by generation of gas is equalized along the entire length of wire 5, whereby the aforementioned partial expansion of the sheath material is prevented. The interposed tape 6 can be formed of particles or fibers consisting of a material which is not dissipated by sintering in a temperature range of 700 to 1000° C. and a material which is dissipated by the sintering. When the flat type wire 5 is sintered, therefore, the binder bonding the particles or the fibers with each other in the tape 6 can be substantially completely burnt and gasified, whereby substantially no strong tensile stress acts between the particles or the fibers. As the flat type wire 5, particularly the metal sheath, expands by the sintering, therefore, the interposed tape material also expands accordingly. When the flat type wire 5 is cooled after the sintering, on the other hand, the tape material contracts in response to contraction of the flat type wire 5, particularly the metal sheath. Therefore, substantially no stress is applied to the heat treated wire 5, whereby deformation such as buckling is prevented. Further, the interposed tape 6 is converted by the heat treatment to a ceramics sintered body which is fragile against an external pressure, whereby the same can be easily separated from the flat type wire 5. The ceramics paper or ceramics sheet which can be obtained as a commercial item at a relatively low cost can be simply employed, whereby the cost for heat treating the wire can be reduced.

According to the present invention, the wire can be heat treated for sintering in a further compact shape. Thus, distribution of the heating temperature is further uniformalized in the wire. According to the present invention, it is possible to prevent the sheath from partial expansion and partial deformation caused by the heat treatment. As the result, a superconducting wire having a high critical current density along its overall length can be obtained. Thus, the present invention is suitable for preparation of a longer oxide superconducting wire. According to the present invention, the interposed tape member can be easily separated from the superconducting wire after the heat treatment, whereby a wire exposing the metal surface can be simply obtained.

EXAMPLE 1

$Bi_2O_3$, PbO, $CaCO_3$, $SrCO_3$ and CuO were employed to prepare powder containing Bi, Pb, Sr, Ca and Cu in composition ratios of 1.8:0.4:2:2.2:3.

This powder was heat treated at 800° C. for 8 hours, and the sintered body as obtained was crushed into powder in an automatic mortar. The powder obtained by crushing was heat treated at 860° C. for 8 hours, and the sintered body as obtained was again crushed in the automatic mortar. The obtained powder was heat treated under vacuum, and thereafter charged in a silver pipe of 15 mm in outer diameter and 10 mm in inner diameter. Then, the silver pipe charged with the powder was wire-drawn and rolled, to obtain a tape-shaped wire of 0.18 mm in thickness.

The tape-shaped wire obtained through the aforementioned steps was coated with a heat-resistant paint (Gamma 1100 by Gamma Chemical Co.) in a thickness of 20 µm, and heat treated at 500° C. to be provided with a heat-resistant coating on its surface. The tape-shaped wire provided with a heat-resistant coating was superposed on another silver sheath tape wire which was separately obtained through the aforementioned steps, and co-wound on a spool of 50 cm diameter in a pancake coil shape as shown in FIG. 3, and tightened. The co-wound material were heat treated in the atmosphere at 845° C. for 50 hours, and then slowly cooled.

EXAMPLE 2

A silver tape of 0.1 mm in thickness was coated with a heat-resistant paint (Gamma 1100 by Gamma Chemical Co.) containing silicone resin in a thickness of 20 µm, and heat treated at 500° C. to be provided with the heat-resistant coating. The silver tape provided with the heat-resistant coating was superposed on a silver sheath tape wire which was formed through the steps of Example 1, and co-wound on a spool of 50 cm in diameter, similarly to Example 1. The co-wound materials were heat treated in the atmosphere at 845° C. for 50 hours, and thereafter slowly cooled.

EXAMPLE 3 (COMPARATIVE EXAMPLE)

A silver sheath wire which was obtained through the steps of Example 1 and a glass tape of 0.3 mm in thickness were co-wound on a spool of 50 cm in diameter, similarly to Example 1. Then, the co-wound materials were heat treated in the atmosphere at 845° C. for 50 hours, and thereafter slowly cooled.

EXAMPLE 4

A silver sheath tape wire which was obtained through the steps of Example 1 was coated with a heat-resistant paint (Ceratop type II by Nekkenkagaku Kougyo Co.) containing metal alkoxide as a main component in a thickness of 20 µm, and thereafter heat treated at 500° C. to be provided with a heat-resistant coating. The tape-shaped wire provided with the heat-resistant coating and a silver sheath wire which was separately obtained through the steps of Example 1 were co-wound on a spool of 50 cm in diameter, similarly to Example 1. Then, the co-wound materials were heat treated in the atmosphere at 845° C. for 50 hours, and thereafter slowly cooled.

EXAMPLE 5

A silver tape of 0.1 mm in thickness was coated with a heat-resistant paint (Ceratop type II by Nekkenkagaku Kougyo Co.) in a thickness of 20 µm, and thereafter heat treated at 500° C. to be provided with a heat-resistant coating. The tape-shaped wire provided with the heat-resistant coating and a silver sheath wire which was obtained through the steps of Example 1 were co-wound on a spool of 50 cm in diameter similarly to Example 1, heat treated in the atmosphere at 845° C. for 50 hours, and thereafter slowly cooled.

EXAMPLE 6

A silver sheath wire which was obtained through the steps of Example 1 was coated with a material prepared by dispersing magnesia powder in alcohol in a thickness of 20 μm, to be provided with an insulating layer of the magnesia powder. The tape-shaped wire provided with the insulating layer and another silver sheath wire which was separately obtained through the steps of Example 1 were superposed with each other, and wound together on a spool of 50 cm in diameter in a pancake coil shape, similarly to Example 1. Then, the pancake-shaped materials were heat treated in the atmosphere at 845° C. for 50 hours, and thereafter slowly cooled.

After the heat treatment, no buckling was observed in Examples 1, 2, 4, 5 and 6, while buckling was observed in Example 3.

After the heat treatment, further, the wires provided with the heat-resistant coating, the glass tape and the wires coated with the magnesia powder were respectively separated from the high-temperature superconducting wires. While the glass tape was so fragile that the same went to pieces after the separation, the wire provided with the heat-resistant coating remained unchanged and was available for repeated use. On the other hand, the wires provided with the heat-resistant coating and the magnesia powder respectively were investigated as to whether or not the formed coatings were easy to separate by a peeling test with adhesive tapes having a grid pattern of 10 by 10 measures of 1 mm drawn thereon. Examples 1, 2, 4 and 5 exhibited results of 100/100, while Example 6 exhibited a result of 14/100. In these indices, the left sides indicate areas of portions bonded with no coatings in the adhesive tapes of 100 mm$^2$. It has been understood from these results that the films obtained by applying the paints strongly adhered to the wires, while the coating of the magnesia powder was easy to separate.

EXAMPLE 7

The high-temperature superconducting wire obtained through the treatment of Example 1 was further rolled into 0.16 mm in thickness, and thereafter coated with a heat-resistant paint (Gamma 1100 by Gamma Chemical Co.) containing silicone resin in a thickness of about 20 μm. Then, the wire coated with the heat-resistant paint was wound on a spool of 10 cm in diameter in a pancake coil shape, and thereafter heat treated at 840° C. for 50 hours.

EXAMPLE 8

The high-temperature superconducting wire obtained through the treatment of Example 2 was further rolled into 0.16 mm in thickness, and thereafter coated with a heat-resistant paint (Ceratop type II by Nekkenkagaku Kougyo Co.) containing metal alkoxide in a thickness of about 20 μm. Then, the wire coated with the heat-resistant paint was wound on a spool of 10 cm in diameter in a pancake coil shape, and thereafter heat treated at 840° C. for 50 hours.

EXAMPLE 9 (COMPARATIVE EXAMPLE)

The high-temperature superconducting wire obtained through the treatment of Example 3 was further rolled into 0.16 mm in thickness, and thereafter superposed on a glass tape of about 0.3 mm in thickness and co-wound on a spool of 10 cm in diameter in a pancake coil shape. Then, the co-wound substance was heat treated at 840° C. for 50 hours.

EXAMPLE 10

The high-temperature superconducting wire obtained by Example 4 was rolled into 0.16 mm in thickness, and thereafter coated with a heat-resistant paint (Ceratop type II by Nekkenkagaku Kougyo Co.) containing metal alkoxide in a thickness of about 20 μm. Then, the wire coated with the heat-resistant paint was wound on a spool of 10 cm in diameter in a pancake coil shape, and thereafter heat treated at 840° C. for 50 hours.

EXAMPLE 11

The high-temperature superconducting wire obtained through the treatment of Example 5 was further rolled into 0.16 mm in thickness, and thereafter coated with a heat-resistant paint (Ceratop type II by Nekkenkagaku Kougyo Co.) containing metal alkoxide in a thickness of about 20 μm. Then, the wire coated with the heat-resistant paint was wound on a spool of 10 cm in diameter in a pancake coil shape, and thereafter heat treated at 840° C. for 50 hours.

EXAMPLE 12

The high-temperature superconducting wire obtained by Example 6 was rolled into 0.16 mm in thickness, and coated with an alcohol solution containing magnesia powder dispersed therein in a thickness of about 40 μm. Then, the wire coated with the magnesia powder was wound on a spool of 10 cm in diameter in a pancake coil shape, and thereafter heat treated at 840° C. for 50 hours.

In relation to Examples 7, 8, 10, 11 and 12, portions of wires were bonded to each other when the same were provided with coatings of 1 μm in thickness, while cracking were observed in coatings which were 150 μm in thickness.

The coils obtained through Examples 7 to 12 were subjected to measurement of critical current densities (Jc) at the liquid nitrogen temperature and occupied volumes. Table 1 shows the results.

TABLE 1

| Example No. | Jc (A/cm$^2$) | Occupied Volume (cm$^3$) |
| --- | --- | --- |
| 7 | 18,000 | 650 |
| 8 | 16,000 | 650 |
| 9 | 6,200 | 1,800 |
| 10 | 15,000 | 650 |
| 11 | 14,000 | 650 |
| 12 | 5,500 | 700 |

As clearly understood from Table 1, high critical current densities were obtained in Examples 7, 8, 10 and 11 employing the steps of coating the wires with the heat-resistant paints. On the other hand, Example 9 exhibited a low critical current density due to influence by buckling caused by differences in thermal expansion coefficient and coefficient of contraction between the wire and the glass tape.

In relation to the insulating coatings formed in Examples 7, 8, 10, 11 and 12, investigation was made as to whether the formed coatings were strongly adhered to the wires or were easy to separate by a peeling test with adhesive tapes having a grid pattern of 10 by 10 measures of 1 mm drawn thereon. Examples 7, 8, 10 and 11 attained results of 100/100, while Example 12 attained a result of 14/100. Thus, the insulating layers formed in Examples 7, 8, 10 and 11 were strongly adhered to the wires, while the insulating layer of magnesia powder was lost in a number of portions in Example 12 to cause partial irregularity in the thickness of the wire, and hence the critical current density was reduced.

In Examples 7 to 12, volumes of the wires which were wound in pancake coil shapes at the time of heat treatment were investigated. As the result, it was found that the occupied volumes can be greatly reduced in Examples 7, 8, 10 and 11 employing the heat-resistant paints as compared with Example 12 employing the glass tape.

EXAMPLE 13

$Bi_2O_3$, PbO, $CaCO_3$, $SrCO_3$ and CuO were employed to prepare powder containing Bi, Pb, Sr, Ca and Cu in composition ratios of 1.8:0.4:2:2.2:3. This powder was heat treated at 800° C. for 8 hours, and thereafter the sintered body as obtained was crushed into powder in an automatic mortar for 2 hours. Then, the powder obtained by crushing was heat treated at 860° C. for 8 hours, and the sintered body as obtained was again crushed in an automatic mortar. The powder obtained by crushing was heat treated under decompression, and thereafter charged in a silver pipe of 15 mm in outer diameter and 10 mm in inner diameter. Then, the silver pipe charged with the powder was wire-drawn and rolled, to obtain a tape-shaped wire of 0.20 mm in thickness.

The tape-shaped wire obtained through the aforementioned steps was coated with a heat-resistant paint (Gamma 1100 by Gamma Chemical Co.) containing silicone resin in a thickness of 20 μm, and thereafter heat treated at 500° C. for providing a heat-resistant coating on its surface. A combustible tape member consisting of craft paper of about 100 μm in thickness was interposed between the tape-shaped wire provided with the heat-resistant coating and another silver sheath wire which was separately obtained through the aforementioned steps. The laminate was co-wound on a spool of 50 cm in diameter and tightened, in a pancake coil shape as shown in FIG. 5. The co-wound wires were heat treated in the atmosphere at 845° C. for 50 hours, and thereafter slowly cooled.

EXAMPLE 14

A combustible tape-shaped wire consisting of a material, which was prepared by mixing alumina and a sizing material, of about 100 μm in thickness was interposed between a tape-shaped wire provided with the heat-resistant coating similarly to Example 13 and a silver sheath tape wire separately obtained through the steps of Example 13. The obtained laminate was co-wound on a spool of 50 cm in diameter and tightened, similarly to the wires shown in FIG. 5. The co-wound wires were heat treated in the atmosphere at 845° C. for 50 hours, and then slowly cooled.

EXAMPLE 15 (COMPARATIVE EXAMPLE)

Figure 7:
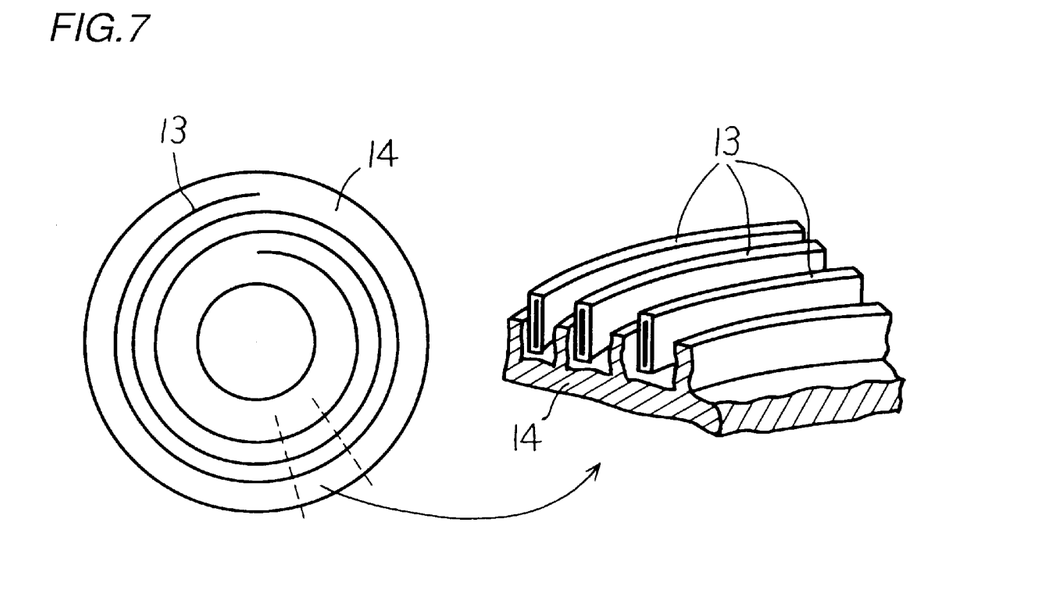
FIG. 7 illustrates a flat type wire according to comparative example which is wound in heat treatment.

As shown in FIG. 7, only a silver sheath tape-shaped wire 13 which was obtained through the steps of Example 13 was wound along a spiral groove which was provided on a stainless disc 14. The wire 13 wound on the stainless disc 14 was then heat treated in the atmosphere at 845° C. for 50 hours, and thereafter slowly cooled.

EXAMPLE 16

The high-temperature superconducting wire obtained as the result of the treatment of Example 13 was further rolled into 0.18 mm in thickness, and thereafter coated with a heat-resistant paint (Gamma 1100 by Gamma Chemical Co.) containing silicone resin in a thickness of about 20 μm. Then, the wire coated with the heat-resistant paint was wound on a spool of 10 cm in diameter in a pancake coil shape, and then heat treated at 840° C. for 50 hours.

EXAMPLE 17

The high-temperature superconducting wire obtained as the result of the treatment of Example 14 was further rolled into 0.18 mm in thickness, and thereafter coated with a heat-resistant paint (Gamma 1100 by Gamma Chemical Co.) containing silicone resin in a thickness of about 20 μm. Then, the wire coated with the heat-resistant paint was wound on a spool of 10 cm in diameter in a pancake coil shape, and thereafter heat treated at 840° C. for 50 hours.

EXAMPLE 18 (COMPARATIVE EXAMPLE)

The high-temperature superconducting wire obtained as the result of the treatment of Example 15 (comparative example) was further rolled into 0.18 mm in thickness, thereafter superposed on a glass tape of 0.3 mm in thickness, and co-wound on a spool of 10 cm in diameter in a pancake coil shape. Thereafter the co-wound materials were heat treated at 840° C. for 50 hours.

As to Examples 13 to 15, windings of the tape wires of 100 m in wire length were subjected to measurement of occupied volumes. Table 2 shows the results.

TABLE 2

| Example No. | Wire Length (m) | Occupied Volume (cm³) |
|---|---|---|
| 13 | 100 | 560 |
| 14 | 100 | 560 |
| 15 | 100 | 12000 |

As to coils obtained in Examples 16 to 18, critical current densities (Jc) and occupied volumes were measured. Table 3 shows the results.

TABLE 3

| Example No. | Jc (A/cm²) | Occupied Volume (cm³) |
|---|---|---|
| 16 | 18,000 | 150 |
| 17 | 17,000 | 150 |
| 18 | 11,000 | 300 |

As clearly understood from Table 2, it was proved that the occupied areas of the wires to be heat treated were remarkably reduced in Examples 13 and 14, as compared with Example 15 according to a conventional method. As clearly understood from Table 3, further, it was proved possible to remarkably reduce the occupied volumes of the coils in Examples 16 and 17, as compared with Example 18. While high critical current densities were attained in the superconducting coils of Examples 16 and 17, the thickness of the wire was partially irregular in the superconducting coil of Example 18 due to insufficient of the heat treatment because of increase of the occupied volume, and hence the critical current density was reduced.

EXAMPLE 19

$Bi_2O_3$, PbO, $CaCO_3$, $SrCO_3$ and CuO were employed to prepare powder containing Bi, Pb, Sr, Ca and Cu in composition ratios of 1.8:0.4:2:2.2:3. This powder was heat treated at 800° C. for 8 hours, and thereafter the sintered body as obtained was crushed into powder in an automatic mortar for 2 hours. Then, the powder obtained by crushing was heat treated at 860° C. for 8 hours, and the sintered body was again crushed in the automatic mortar. The powder obtained by crushing was temporarily sintered under vacuum, and thereafter charged in a silver pipe of 15 mm in outer diameter and 10 mm in inner diameter. Then, the silver pipe charged with the powder was wire-drawn, and 61 such silver sheath wires obtained after the drawing were engaged with each other and further subjected to wire drawing and rolling, to obtain a multifilamentary tape-shaped wire of 0.2 mm in thickness.

On the other hand, a ceramic paper of 0.1 mm in thickness, which was mainly composed of ceramics (alumina) and a cellulose based binder, was cut into the same width as the obtained tape wire, to prepare a tape-shaped insulating material.

The tape-shaped wire obtained through the aforementioned steps was superposed on the tape-shaped ceramics paper of 0.1 mm in thickness, and co-wound on a spool of 50 cm in diameter similarly to the wire shown in FIG. 6. The co-wound materials were sintered in the atmosphere at 845° C. for 50 hours, and thereafter slowly cooled.

EXAMPLE 20

The wire sintered in Example 19 was taken out, rolled into 0.18 mm in thickness, superposed on the tape-shaped ceramics paper, and co-wound on a spool of 50 cm in diameter, similarly to Example 19. The co-wound materials were sintered in the atmosphere at 840° C. for 50 hours, and thereafter slowly cooled.

EXAMPLE 21 (COMPARATIVE EXAMPLE)

Figure 8:
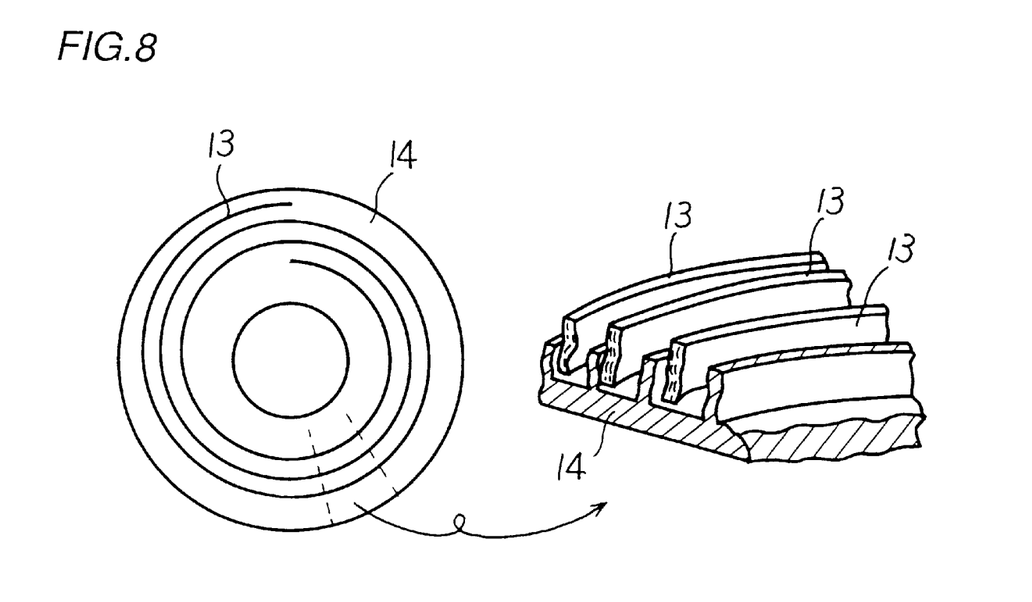
FIG. 8 illustrates a flat type wire according to another comparative example which is wound in heat treatment.

Only a silver sheath tape wire obtained through the steps of Example 19 was wound along a spiral groove provided on a stainless disc 14, as shown in FIG. 8. The wire 13 wound on the stainless disc 14 was then sintered in the atmosphere at 840° C. for 50 hours, and thereafter slowly cooled. Further, this wire was rolled into 0.18 mm in thickness, and again wound along the spiral groove provided on the stainless disc 14, and sintered at 840° C. for 50 hours.

In relation to Examples 19 to 21, the tape-shaped wires of 100 m in wire length were subjected to measurement of occupied volumes. Table 4 shows the results. Further, the superconducting wires of Examples 20 and 21 were subjected to measurement of critical current densities (Jc) at the liquid nitrogen temperature. Table 4 also shows the results.

TABLE 4

| Example No. | Wire Length (m) | Occupied Volume (cm$^3$) | Jc (A/cm$^2$) |
| --- | --- | --- | --- |
| 19 | 100 | 130 | — |
| 20 | 100 | 130 | 15,000 |
| 21 | 100 | 12,0000 | 12,000 |

As clearly understood from Table 4, it was proved that the wires were brought into compact shapes and the occupied volumes were remarkably reduced in Examples 19 and 20. Thus, it was confirmed possible to prepare a long superconducting wire having a higher critical current density also in a sintering furnace having a limited space.

EXAMPLE 22

$Bi_2O_3$, PbO, $CaCO_3$, $SrCO_3$ and CuO were employed to prepare powder containing Bi, Pb, Sr, Ca and Cu in the composition ratio of 1.8:0.4:2:2.2:3. This powder was heat treated at 800° C. for 8 hours, and then the sintered body was crushed into powder in an automatic mortar for 2 hours. Then, the powder obtained by crushing was heat treated at 860° C. for 8 hours, and the sintered body was again crushed in the automatic mortar. The powder obtained by crushing was heat treated under vacuum, and charged in a silver pipe of 36 mm in outer diameter, 30 mm in inner diameter and 1,000 mm in length. Then, the silver pipe charged with the powder was wire-drawn and rolled to obtain a tape-shaped wire of 0.18 mm in thickness.

On the other hand, a ceramics paper prepared from a composition which was obtained by mixing alumina fibers of about 2 μm in average diameter and about 100 μm in average length and a cellulose based binder in a weight ratio of 1:1 was shaped into a tape of 3 mm in width and 0.2 mm in thickness.

The obtained silver sheath tape wire was superposed on the ceramics paper tape, and densely wound in a pancake coil shape. The employed spool was 500 mm in diameter. The pancake obtained by winding the silver sheath tape wire of 1,000 m in length with the ceramics paper on the spool was about 1,000 mm in diameter, 500 mm in inner diameter and 3 mm in thickness. The wire wound in a pancake shape was heated at 840° C. for 50 hours. In the heating process, the binder contained in the ceramics paper was gasified and evaporated by oxidative reaction at a temperature of 300 to 600° C. In the heat treatment, the ceramics paper was powdered to serve as an excellent separator on the surface of the silver sheath tape wire for preventing portions of the silver sheath from adhesion. After the heat treatment, the wire was released from the spool. At this time, it was possible to easily remove the powdered ceramics paper by softly rubbing the same with a waste cloth. The wire was again rolled. Then, the wire was again superposed on with a ceramics paper similarly to the above, densely wound in a pancake coil shape, and heat treated at 840° C. for 50 hours. The oxide superconducting wire obtained through the aforementioned process was 1,080 m in length, and exhibited a critical current density of about 4,020 A/cm$^2$ at the liquid nitrogen temperature. Table 5 shows characteristics of superconducting wires of different lengths which were prepared according to the aforementioned process.

TABLE 5

| Wire Length (m) | Critical Current Value Ic(A) | Critical Current Density Jc(A/cm$^2$) |
| --- | --- | --- |
| 1,080 | 2.4 | 4,020 |
| 623 | 26.4 | 15,900 |
| 518 | 17.7 | 13,500 |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a high-temperature superconducting wire comprising an oxide superconductor covered with at least one stabilizing material selected from the group consisting of silver and a silver alloy, said method comprising the steps of:

preparing a flat wire by charging powder consisting essentially of an oxide superconductor into a sheath consisting essentially of at least one stabilizing material selected from the group consisting of silver and a silver alloy, and then flattening said sheath charged with said powder;

providing a protective tape comprising base material particles, and a binder joining said base material particles together;

superposing said protective tape and said flat wire with each other, thereby forming a unit, and winding this unit into a pancake coil shape so that portions of said flat wire are not in contact with each other, and are separated from each other by said protective tape;

heat treating and then cooling the unit wound into the pancake coil shape, thereby sintering said oxide superconductor while causing expansion and then contraction of the flat wire and dissipation of said binder but not of said base material particles, whereby the dissipation of said binder causes at least some of the base material particles to become unjoined from one another such that the protective tape does not induce stresses on the flat wire which would cause buckling of the flat wire during the expansion and contraction thereof without dissipation of the binder, and whereby the proactive tape prevents adhesion between adjacent turns of the coiled flat wire without diffusion of the base material into the coiled flat wire; and separating said flat wire from said protective tape.

2. The method of producing a high-temperature superconducting wire in accordance with claim 1, wherein said base material consist essentially of ceramics, and said binder consists essentially of an organic sizing material.

3. The method of producing a high-temperature superconducting wire in accordance with claim 2, wherein said ceramics consists essentially of alumina.

4. The method of producing a high-temperature superconducting wire in accordance with claim 2, wherein said organic sizing material is a cellulose based adhesive.

5. The method of producing a high-temperature superconducting wire in accordance with claim 1, wherein said protective tape is in a range of about 50 to 1000 $\mu$m in thickness.

6. The method of producing a high-temperature superconducting wire in accordance with claim 1, wherein said oxide superconductor consists essentially of a bismuth based oxide superconductor.

7. The method of producing a high-temperature superconducting wire in accordance with claim 1, wherein said base material consists essentially of at least one material selected from the group consisting of ceramics particulates of about 2 to 20 $\mu$m in particle size and ceramics short fibers of about 10 to 200 $\mu$m in length and 2 to 20 $\mu$m in width, and said binder consists essentially of organic sizing material.

8. The method of producing a high-temperature superconducting wire in accordance with claim 7, wherein said base material consists essentially of ceramics short fibers of about 10 to 200 $\mu$m in length and 2 to 20 $\mu$m in width.

9. The method of producing a high-temperature superconducting wire in accordance with claim 8, wherein said ceramics consists essentially of alumina.

10. The method of producing a high-temperature superconducting wire in accordance with claim 9, wherein said binder is gasified and evaporated at a temperature of 300 to 600° C.

11. The method of producing a high-temperature superconducting wire in accordance with claim 8, wherein said organic sizing material is a cellulose based adhesive.

12. The method of producing a high-temperature superconducting wire in accordance with claim 7, wherein said ceramics consists essentially of alumina.

13. The method of producing a high-temperature superconducting wire in accordance with claim 7, wherein said binder is gasified and evaporated at a temperature of 300 to 600° C.

14. The method of producing a high-temperature superconducting wire in accordance with claim 7, wherein said binder is gasified and evaporated at a temperature of 300 to 600° C.

15. The method of producing a high-temperature superconducting wire in accordance with claim 7, wherein said organic sizing material is a cellulose based adhesive.

16. The method of producing a high-temperature superconducting wire in accordance with claim 7, wherein said protective tape is in a range of about 50 to 1000 $\mu$m in thickness.

17. The method of producing a high-temperature superconducting wire in accordance with claim 7, wherein said oxide superconductor consists essentially of a bismuth based oxide superconductor.

* * * * *